United States Patent
Zhou

(10) Patent No.: US 11,205,617 B2
(45) Date of Patent: Dec. 21, 2021

(54) INTERCONNECT STRUCTURE HAVING A GRAPHENE LAYER

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Ming Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/893,460

(22) Filed: Feb. 9, 2018

(65) Prior Publication Data
US 2018/0166391 A1    Jun. 14, 2018

Related U.S. Application Data

(62) Division of application No. 15/477,829, filed on Apr. 3, 2017, now Pat. No. 9,929,096.

(30) Foreign Application Priority Data
Jul. 1, 2016 (CN) .......................... 201610512129.X

(51) Int. Cl.
*H01L 23/532* (2006.01)
*H01L 21/768* (2006.01)
(Continued)

(52) U.S. Cl.
CPC ...... *H01L 23/53233* (2013.01); *H01L 21/485* (2013.01); *H01L 21/768* (2013.01);
(Continued)

(58) Field of Classification Search
CPC ......... H01L 23/53233; H01L 23/53238; H01L 21/768; H01L 21/76829; H01L 21/76849;
(Continued)

(56) References Cited

U.S. PATENT DOCUMENTS 6,204,192 B1    3/2001   Zhao et al.
6,878,616 B1 *  4/2005   Casey ............... H01L 21/02343
                                                      438/623
(Continued)

FOREIGN PATENT DOCUMENTS

CN           107564888           1/2018

OTHER PUBLICATIONS

U.S. Appl. No. 15/477,829, Corrected Notice of Allowability dated Dec. 1, 2017, 2 pages.
(Continued)

*Primary Examiner* — Walter H Swanson
(74) *Attorney, Agent, or Firm* — Anova Law Group, PLLC

(57) ABSTRACT

An interconnect structure includes a substrate, a dielectric layer on the substrate, a metal interconnect layer in the dielectric layer and in contact with the substrate, the metal interconnect layer having an upper surface flush with an upper surface of the dielectric layer, and a graphene layer on the metal interconnect layer. The graphene layer insulates a metal from air and prevents the metal from being oxidized by oxygen in the air, thereby increasing the queue time for the CMP process and the device reliability.

20 Claims, 16 Drawing Sheets

(51) Int. Cl.
 *H01L 21/48* (2006.01)
 *H01L 21/8234* (2006.01)
 *H01L 21/8238* (2006.01)
 *H01L 23/29* (2006.01)
 *H01L 23/492* (2006.01)

(52) U.S. Cl.
 CPC .. *H01L 21/76829* (2013.01); *H01L 21/76849* (2013.01); *H01L 21/76895* (2013.01); *H01L 21/823475* (2013.01); *H01L 21/823871* (2013.01); *H01L 23/29* (2013.01); *H01L 23/4928* (2013.01); *H01L 23/53238* (2013.01); *H01L 21/76811* (2013.01); *H01L 21/76813* (2013.01)

(58) Field of Classification Search
 CPC ............. H01L 21/76895; H01L 21/485; H01L 21/823475; H01L 21/823871
 See application file for complete search history.

(56) References Cited

U.S. PATENT DOCUMENTS

| | | | |
|---|---|---|---|
| 2005/0067633 A1* | 3/2005 | Mushika | B81B 7/0006 257/202 |
| 2005/0170633 A1 | 8/2005 | Sasaki et al. | |
| 2011/0059599 A1 | 3/2011 | Ward et al. | |
| 2012/0080661 A1 | 4/2012 | Saito et al. | |
| 2012/0080662 A1* | 4/2012 | Saito | H01L 21/28556 257/29 |
| 2012/0080796 A1 | 4/2012 | Wada et al. | |
| 2012/0139114 A1* | 6/2012 | Zhang | H01L 21/76849 257/751 |
| 2012/0168723 A1 | 7/2012 | Park | |
| 2012/0276737 A1* | 11/2012 | Wang | H01L 21/02063 438/653 |
| 2013/0146846 A1 | 6/2013 | Adkisson et al. | |
| 2014/0015015 A1 | 1/2014 | Krivokapic et al. | |
| 2014/0024211 A1 | 1/2014 | Ott et al. | |
| 2014/0106561 A1 | 4/2014 | Niyogi et al. | |
| 2014/0145332 A1 | 5/2014 | Ryan et al. | |
| 2014/0167268 A1 | 6/2014 | Bao et al. | |
| 2014/0235049 A1 | 8/2014 | Yang et al. | |
| 2014/0284802 A1 | 9/2014 | Sakata et al. | |
| 2014/0291819 A1 | 10/2014 | Barth | |
| 2014/0367857 A1 | 12/2014 | Yang et al. | |
| 2015/0170959 A1* | 6/2015 | Huang | H01L 21/76816 257/775 |
| 2016/0268200 A1* | 9/2016 | Ishikura | H01L 23/5283 |
| 2018/0005952 A1 | 1/2018 | Zhou | |

OTHER PUBLICATIONS

U.S. Appl. No. 15/477,829, Corrected Notice of Allowability dated Dec. 7, 2017, 2 pages.
U.S. Appl. No. 15/477,829, Non-Final Office Action dated Aug. 11, 2017, 12 pages.
U.S. Appl. No. 15/477,829, Notice of Allowance dated Nov. 17, 2017, 7 pages.
U.S. Appl. No. 15/477,829, Restriction Requirement dated May 16, 2017, 5 pages.
European Patent Application No. 17178739.3, Extended European Search Report dated Nov. 7, 2017, 7 pages.
European Patent Application No. 17178818.5, Extended European Search Report dated Nov. 15, 2017, 10 pages.

* cited by examiner

INTERCONNECT STRUCTURE HAVING A GRAPHENE LAYER

CROSS-REFERENCES TO RELATED APPLICATIONS

The present application is a divisional of U.S. application Ser. No. 15/477,829, filed on Apr. 3, 2017, which claims priority to Chinese patent application No. 201610512129.X, filed with the State Intellectual Property Office of People's Republic of China on Jul. 1, 2016, the contents of which are incorporated herein by reference in their entirety.

FIELD OF THE INVENTION

The present invention relates to semiconductor technology, and more particularly to a semiconductor interconnect structure and the method of forming the same.

BACKGROUND OF THE INVENTION

A gradual reduction in the dimension of interconnect structures may limit the speed of signal propagation in semiconductor devices. The use of copper and low-k dielectric materials may reduce the delay in signal propagation. However, electromagnetic simulations showed that the diffusion of copper into a dielectric layer will affect the effective dielectric k constant value of the dielectric layer, and that the diffusion effect becomes more significant with increasing diffusion severity that can cause short circuits in integrated circuits. Furthermore, copper is easily oxidized by air, resulting in a relatively short queue time (Q-time) of a chemical mechanical planarization (CMP) process, which is disadvantageous to the development of semiconductor manufacturing processes.

BRIEF SUMMARY OF THE INVENTION

The present inventor discovered existing manufacturing problems and provides novel technical solutions to the identified problems outlined above.

Embodiments of the present invention provide a method of manufacturing an interconnect structure. The method may include providing a semiconductor structure comprising a substrate, a dielectric layer on the substrate, and a metal interconnect layer in the dielectric layer and in contact with the substrate, and forming a graphene layer on the metal interconnect layer.

In one embodiment, forming the graphene layer includes forming an amorphous carbon layer on the dielectric layer, the amorphous carbon layer being adjacent to the graphene layer. In one embodiment, forming the graphene layer includes introducing methane and a carrier gas into a reaction chamber to form a mixed gas, the mixed gas having a volume ratio of methane in a range between 0.1% and 50%, at a temperature in a range between 300° C. and 450° C., under a pressure in a range between 0.1 mTorr and 10 Torr, and a radio frequency power in a range between 10 W and 1000 W.

In one embodiment, the carrier gas comprises nitrogen, or hydrogen, or nitrogen and hydrogen.

In one embodiment, the method may further include, prior to forming the graphene layer, performing a hydrogen plasma cleaning process on an upper surface of the metal interconnect layer. In one embodiment, performing the hydrogen plasma cleaning process comprises: introducing a hydrogen gas into a reaction chamber at a flow rate in a range between 10 sccm and 3000 sccm, at a temperature in a range between 300° C. and 450° C., under a pressure in a range between 0.1 mTorr and 10 Torr, and a radio frequency power in a range between 10 W and 2000 W.

In one embodiment, the graphene layer includes 1 to 30 layers of graphene monoatomic layers.

In one embodiment, the substrate includes a semiconductor substrate, the dielectric layer includes a first dielectric layer on the semiconductor substrate, the metal interconnect layer includes a first metal interconnect layer formed in the first dielectric layer and in contact with the semiconductor substrate.

In one embodiment, providing the semiconductor structure includes providing a substrate structure, which comprising the semiconductor substrate and the first dielectric layer on the semiconductor substrate, performing an etching process on the first dielectric layer to form a first through-hole extending to the semiconductor substrate, forming a first barrier layer on sidewalls and at a bottom of the first through-hole, forming a first metal interconnect layer on the first barrier layer, and planarizing the substrate structure after forming the first metal interconnect layer to expose an upper surface of the first dielectric layer.

In one embodiment, the graphene layer is formed on the first metal interconnect layer, and the amorphous carbon layer is formed on the first dielectric layer.

In one embodiment, the first though-hole is a though-hole having a damascene structure.

In one embodiment, forming the first metal interconnect layer on the first barrier layer includes forming a first metal seed layer on the first barrier layer, and forming the first metal interconnect layer on the first metal seed layer using an electroplating process.

In one embodiment, the dielectric layer further includes a second dielectric layer on the first dielectric layer, the metal interconnect layer further includes a second metal interconnect layer formed on the second dielectric layer and in contact with the first metal interconnect layer. Providing the semiconductor structure further includes forming a second dielectric layer on the first dielectric layer and the first metal interconnect layer, performing an etching process on the second dielectric layer to form a second through-hole extending to the first metal interconnect structure, forming a second barrier layer on sidewalls and at a bottom of the second through-hole, forming a second metal interconnect structure on the second barrier layer, and planarizing the substrate structure after forming the second metal interconnect structure to expose an upper surface of the second dielectric layer. The graphene layer is formed on the second metal interconnect layer, and the amorphous carbon layer is formed on the second dielectric layer.

In one embodiment, the second though-hole is a though-hole having a damascene structure. The first dielectric layer includes a first silicon carbon nitride layer on the semiconductor substrate, a first silicon oxide layer on the first silicon carbon nitride layer, and a first low-k dielectric layer on the first silicon oxide layer, and the second dielectric layer includes a second silicon carbon nitride layer on the first dielectric layer and the first metal interconnect layer, a second oxide layer on the second silicon carbon nitride layer, and a second low-k dielectric layer on the second silicon oxide layer.

In one embodiment, the first barrier layer and the second barrier layer each comprise tantalum nitride and tantalum; and the first metal interconnect layer and the second metal interconnect layer each comprise copper.

In one embodiment, the first low-k dielectric layer and the second low-k dielectric layer each include a porous or non-porous SiOCH layer.

In one embodiment, the method may further include forming a third dielectric layer on the graphene layer and the amorphous carbon layer to a next interconnect structure.

Embodiments of the present invention also provide an interconnect structure. The interconnect structure may include a substrate, a dielectric layer on the substrate, a metal interconnect layer in the dielectric c layer and in contact with the substrate, the metal interconnect layer having an upper surface flush with an upper surface of the dielectric layer, and a graphene layer on the metal interconnect layer.

In one embodiment, the interconnect structure may also include an amorphous carbon layer on the dielectric layer and laterally adjacent to the graphene layer.

In one embodiment, the graphene layer comprises 1 to 30 layers of graphene monoatomic layers.

In one embodiment, the metal interconnect layer is a metal interconnect layer comprising a damascene structure.

In one embodiment, the interconnect structure further include a barrier layer disposed between the dielectric layer and the metal interconnect layer.

In one embodiment, the barrier layer comprises tantalum nitride and tantalum, and the metal interconnect layer comprises copper.

In one embodiment, the substrate includes a semiconductor substrate. The dielectric layer further includes a first dielectric layer on the semiconductor substrate, and the metal interconnect layer includes a first metal interconnect layer formed in the first dielectric layer and in contact with the semiconductor substrate.

In one embodiment, the graphene layer is formed on the first metal interconnect structure, and the amorphous carbon layer is formed on the first dielectric layer.

In one embodiment, the dielectric layer further includes a second dielectric layer formed on the first dielectric layer, the metal interconnect layer further includes a second metal interconnect layer formed on the second dielectric layer and in contact with the first metal interconnect layer, the graphene layer is formed on the second metal interconnect layer, and the amorphous carbon layer is formed on the second dielectric layer.

In one embodiment, the first dielectric layer includes a first silicon carbon nitride layer on the semiconductor substrate, a first silicon oxide layer on the first silicon carbon nitride layer, and a first low-k dielectric layer on the first silicon oxide layer. The second dielectric layer includes a second silicon carbon nitride layer on the first dielectric layer and the first metal interconnect layer, a second oxide layer on the second silicon carbon nitride layer, and a second low-k dielectric layer on the second silicon oxide layer.

In one embodiment, the first low-k dielectric layer and the second low-k dielectric layer each comprise a porous or non-porous SiOCH layer.

In one embodiment, the interconnect structure may further include a third dielectric layer on the graphene layer and the amorphous carbon layer for a next interconnect structure.

The following detailed description together with the accompanying drawings will provide a better understanding of the nature and advantages of the present invention.

DETAILED DESCRIPTION OF THE INVENTION

Figure 1:
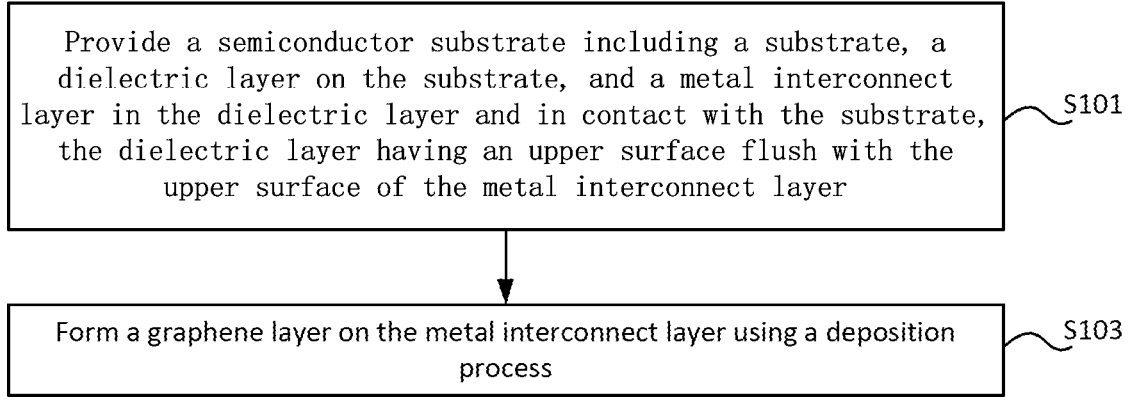
FIG. 1 is a flowchart illustrating a method for manufacturing an interconnect structure according to one embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a flowchart illustrating a method for manufacturing an interconnect structure according to one embodiment of the present invention. The method may include the following steps:

S101: providing a semiconductor structure including a substrate, a dielectric layer on the substrate, and a metal interconnect layer formed in the dielectric layer and in contact with the substrate. The dielectric layer has an upper surface flush with the upper surface of the metal interconnect layer.

S103: forming a graphene layer on the metal interconnect layer using a graphene deposition process.

Thus, a method of forming an interconnect structure according to an embodiment of the present invention is provided. In the method, the graphene layer can insulate a metal from air and prevent the metal from being oxidized by oxygen in the air, so that the queue time of the CMP process can be increased, which is advantageous to semiconductor manufacturing processes and improve the device reliability.

As used herein, the term "substrate" may include, but is not limited to, a substrate of a semiconductor material (e.g., a silicon substrate). In an example embodiment, the term "substrate" may also include a semiconductor device formed on a substrate of a semiconductor material. In another example embodiment, the term "substrate" may also include a metal contact formed on a substrate of a semiconductor material.

As used herein, the term "flush" may include, but is not limited to, a substantially flat surface instead of absolute flat, that allows for some errors within the process tolerance and coplanar with another flat surface. In other words, the term "flush" is defined to include surfaces that are substantially disposed on the same plane, but may include minor differences with the process tolerance.

In one embodiment, a graphene deposition may be performed using a plasma enhanced chemical vapor deposition (PECVD). In an example embodiment, the graphene deposition may be carried out or performed using a mixed gas including methane ($CH_4$) and a carrier gas in a reaction chamber, the volume of methane in the mixed gas may be in the range between 0.1% and 50% (e.g., 0.4%, 10%, or 20%, etc.), at a temperature between about 300° C. and about 450° C. (e.g. 350° C., 372° C., 400° C., or 425° C.), under a pressure between 0.1 mTorr and 10 Torr (e.g., 25 mTorr, 30 mTorr, 1 Torr, or 5 Torr), and at a RF power between 10 W and 1000 W (e.g., 40 W). In an exemplary embodiment, the graphene deposition process can be implemented on an 8×13 $mm^2$ wafer.

In another embodiment, the volume ratio of methane ($CH_4$), nitrogen ($N_2$) and hydrogen ($H_2$) may be $CH_4:N_2:H_2=1:x:y$, where x may be any value between 0.1 and 30, and y may be any value between 0.1 and 30.

In one embodiment, the carrier gas may include nitrogen and/or hydrogen. That is, the carrier gas may include nitrogen, or hydrogen, or nitrogen and hydrogen.

In one embodiment, the flow rate of methane may range between 2 sccm and 5 sccm (e.g., 4 sccm). In one embodiment, the flow rate of the carrier gas may range between 50 sccm and 10,000 sccm.

In one embodiment, the graphene layer may include one or more graphene monoatomic layers (also referred to as monolayer graphene layers), such as the graphene monoatomic layers may include from 1 layer to 30 layers. In one embodiment, the graphene monoatomic layers can be controlled to achieve the desired number of layers by controlling the time of graphene deposition.

In one embodiment, the step of performing graphene deposition may also include forming an amorphous carbon layer on the dielectric layer. The graphene layer is laterally adjacent to the amorphous carbon layer. That is, the graphene deposition may be selective formed. During the graphene deposition process described above, different structures can be formed on different substrates, e.g., a graphene layer may be formed on a metal interconnect layer while an amorphous carbon layer may be formed on the dielectric layer (e.g., a low-k dielectric layer). In other words, during the graphene deposition, a graphene layer and an amorphous carbon layer are simultaneously or concurrently formed. The amorphous carbon layer can act as an insulator layer to prevent the graphene layers on the different metal interconnect layers from being interconnected to each other, thereby preventing the different metal interconnect layers from being interconnected to each other.

In another embodiment, the graphene deposition may also be performed without forming a thin film layer on the dielectric layer, e.g., without forming a graphene layer and an amorphous carbon layer on the dielectric layer. In this embodiment, a graphene layer is formed on a metal interconnect layer, but no thin film layer is formed on the dielectric layer, it is also possible to insulate the graphene layers on the different metal interconnect layers, so that interconnection between the different metal interconnect layers may be prevented.

In one embodiment, prior to performing the graphene deposition, the method may further include performing a hydrogen plasma cleaning process on the upper surface of the metal interconnect layer. The hydrogen plasma cleaning process may clean the surface of the metal interconnect layer, thereby facilitating the growth of the graphene layer thereon.

In one embodiment, the hydrogen plasma cleaning process may be performed in a reaction chamber using a plasma enhanced chemical vapor deposition (PECVD). In an example embodiment, the hydrogen plasma cleaning process may be performed by introducing hydrogen gas into a reaction chamber at a flow rate between 10 sccm and 3000 sccm (e.g., 100 sccm, 500 sccm, or 1000 sccm), at a temperature between about 350° C. and about 450° C. (e.g. 350° C. or 425° C.), under a pressure between 0.1 mTorr and 10 Torr (e.g., 1 Torr, 5 Torr, or 8 Torr), and at a radio frequency (RF) power between 10 W and 2000 W (e.g., 20 W, 1000 W, 500 W or 1000 W).

In one embodiment, the method may further include forming a dielectric layer on the graphene layer and the amorphous carbon layer for use in a next interconnect structure.

In one embodiment, the substrate may include a semiconductor substrate. In one embodiment, the dielectric layer may include a first dielectric layer on the semiconductor substrate. In one embodiment, the metal interconnect layer may include a first metal interconnect layer formed in the first dielectric layer and in contact with the semiconductor substrate.

Figure 2A:
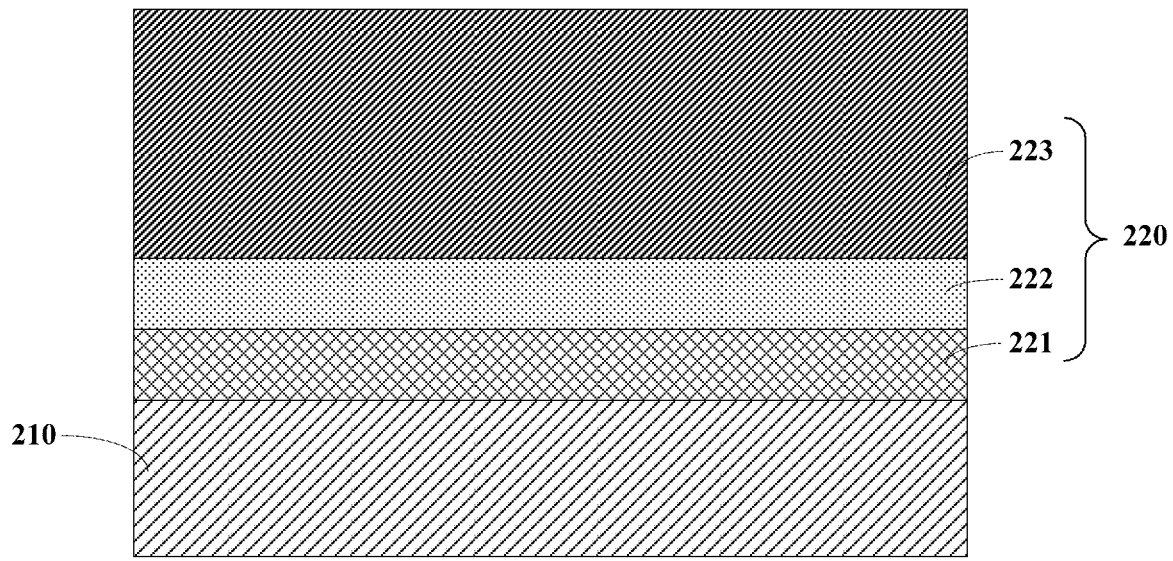
FIGS. 2A-2H are cross-sectional views illustrating intermediate stages of an interconnect structure according to one embodiment of the present invention.

FIGS. 2A through 2F are cross-sectional views illustrating intermediate stages of an interconnect structure according to one embodiment of the present invention. A method of forming a semiconductor substrate will be described in detail below with reference to FIGS. 2A through 2F. The method may include:

Referring to FIG. 2A, a substrate structure is provided. The substrate structure may include a semiconductor substrate (e.g., a semiconductor substrate including a semiconductor device) 210 and a first dielectric layer 220 on semiconductor substrate 210.

In one embodiment, as shown in FIG. 2A, first dielectric layer 220 may include a first silicon carbon nitride (SiCN) layer 221 on semiconductor substrate 210, a first silicon oxide layer 222 on first silicon carbon nitride layer 221, and a first low-k dielectric layer 223 on first silicon oxide layer 222. The first silicon oxide layer may also be referred to as an initial layer. In one embodiment, the first silicon oxide layer may include silicon dioxide. In one embodiment, the first silicon oxide layer may include a very low amount of carbon. In one embodiment, the first low-k dielectric layer may include an ultra-low k dielectric constant material. For example, the first low-k dielectric layer may include a porous or non-porous hydrogenated silicon-carbide (SiOCH) layer.

In one embodiment, the step of providing the above-described substrate structure may include forming a first silicon carbon nitride layer 221 on semiconductor substrate 210 using a deposition process. In an exemplary embodiment, the step may also include forming first silicon oxide layer 222 on first silicon carbon nitride layer 221 using a deposition process. In an exemplary embodiment, the step may also include forming a first low-k dielectric layer 223 on first silicon oxide layer 222 using a deposition process.

Figure 2B:
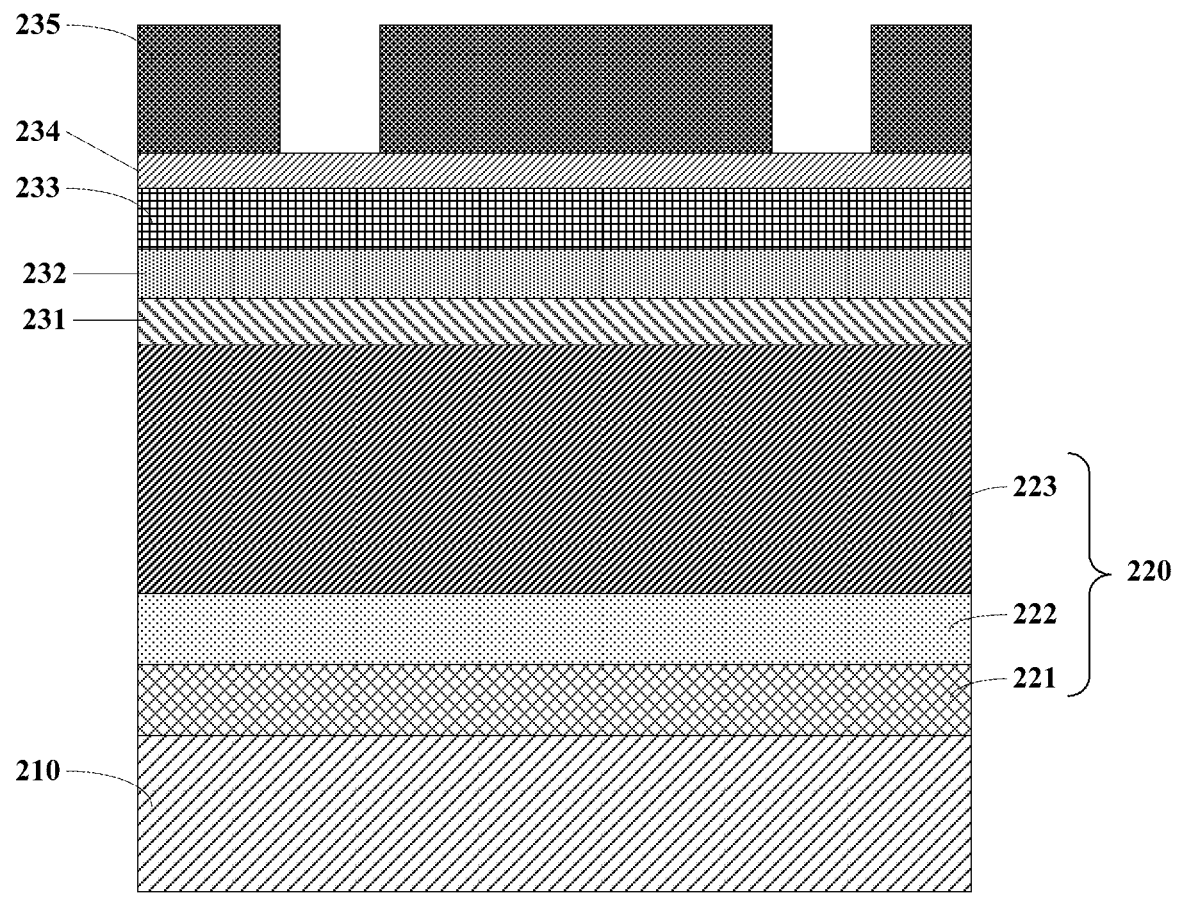
Figure 2C:
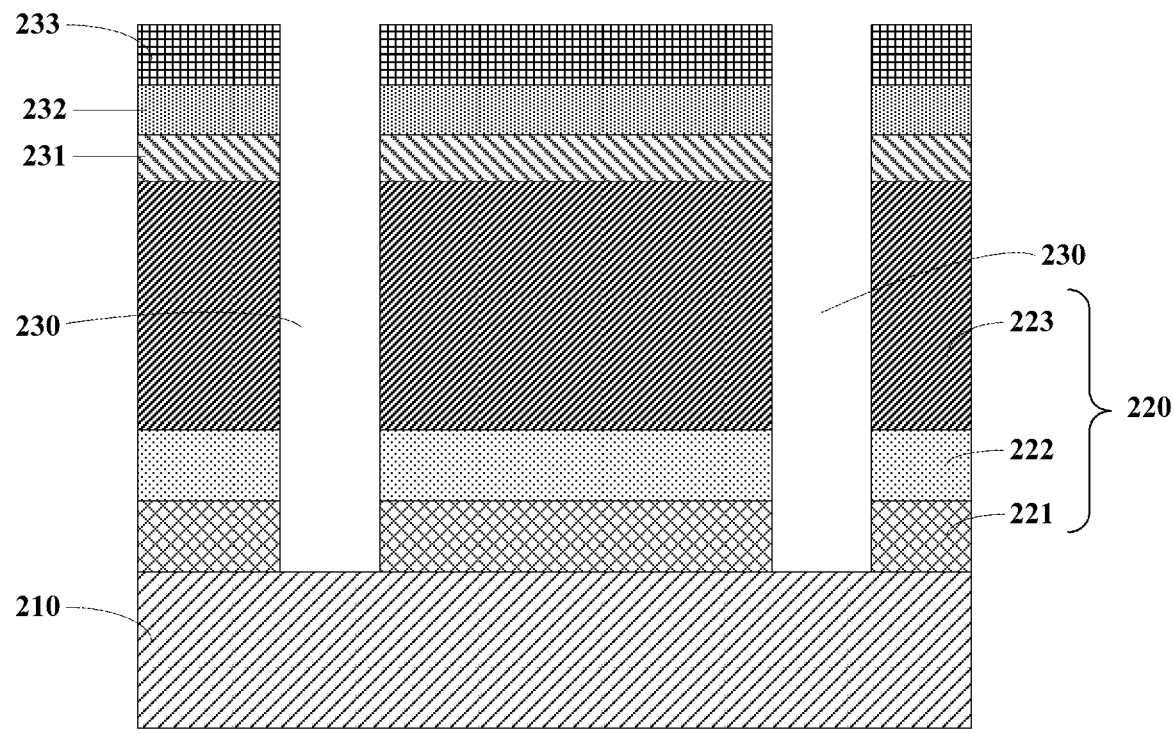

Next, an etch process is performed on first dielectric layer 220 to form a first through-hole extending onto semiconductor substrate 210. Referring to FIG. 2B, a first HMBD hardmask (e.g., a SiOCH hardmask) layer 231, a first HMTEOS hardmask (TEOS hardmask) layer 232, a first TiN (titanium nitride) layer 233, a first screen oxide (e.g., silicon oxide) layer 234, and a patterned first mask (e.g., photoresist) layer 235 are sequentially formed on semiconductor substrate 210. Thereafter, as shown in FIG. 2C, an etching process (e.g., dry etching and/or wet etching) is performed using patterned first mask layer 235 as a mask to form a first through-hole 230. First mask layer 235 and first screen oxide layer 234 are then removed, as shown in FIG. 2C.

In one embodiment, the first through-hole may be a through-hole having a damascene structure. The process of forming the through-hole having a damascene structure will be described in detail below.

Figure 2D:
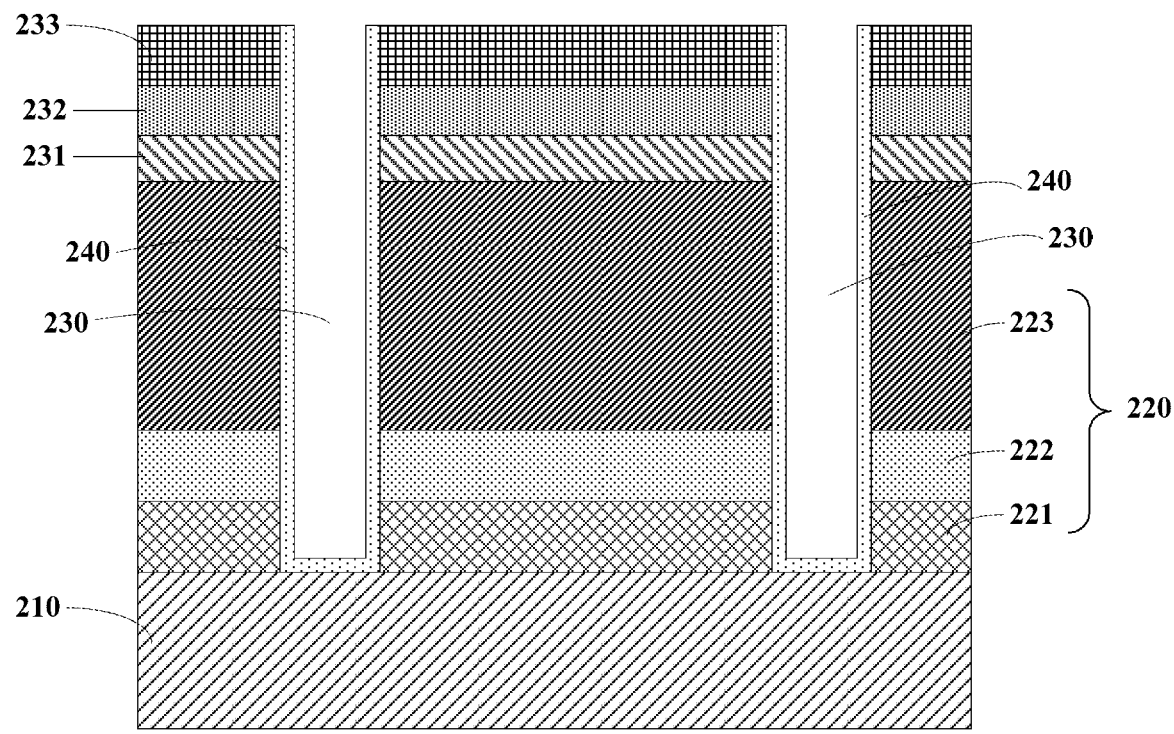

Next, referring to FIG. 2D, a first barrier layer 240 is formed on sidewalls and at the bottom of first through-hole 230 using a physical vapor deposition (PVD) process.

In another embodiment, first barrier layer 240 may also be formed on the upper surface of first TiN layer 233, as shown in FIG. 2D.

In one embodiment, first barrier layer 240 may include tantalum nitride (TaN) and tantalum (Ta).

Figure 2E:
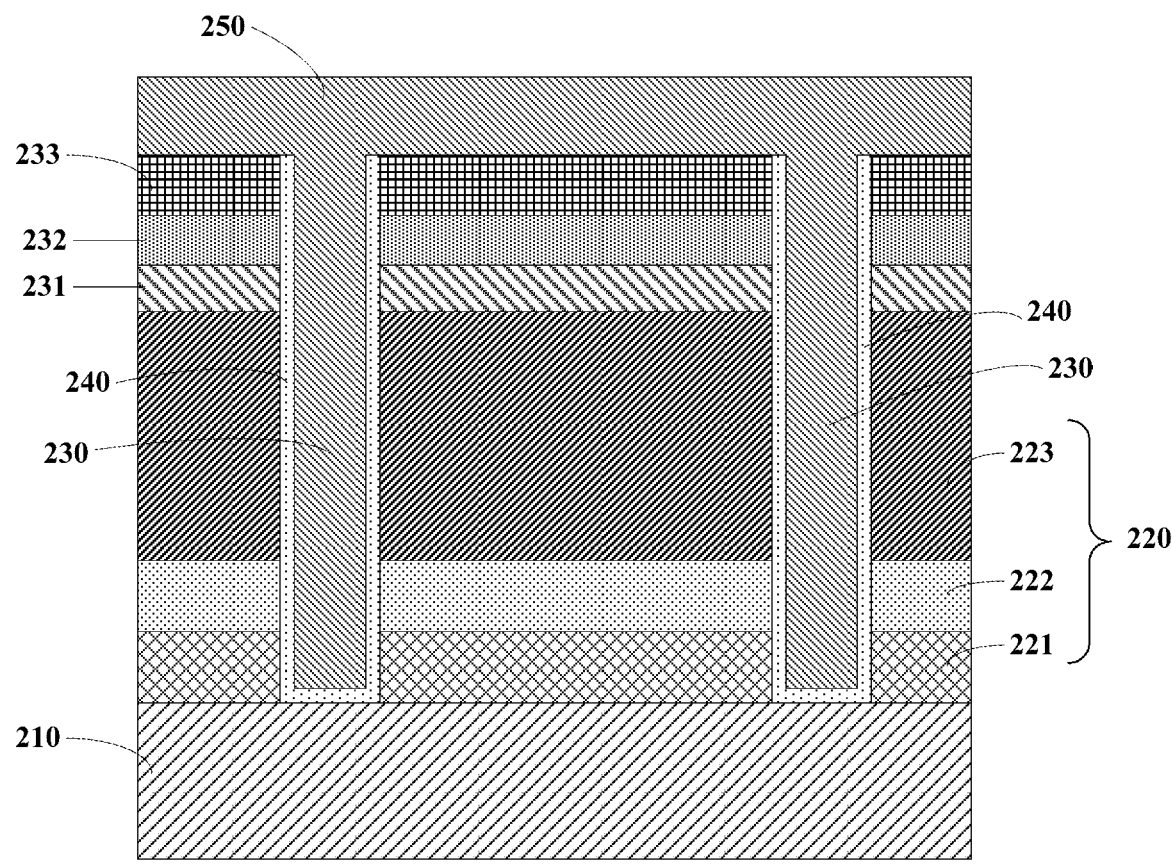

Next, referring to FIG. 2E, a first metal interconnect layer 250 is formed on first barrier layer 240 in first through-hole 230. First metal interconnect layer 250 fills first through-hole 230. In one embodiment, the first metal interconnect layer may include copper.

In one embodiment, the step of forming the first metal interconnect layer may include forming a first metal seed layer (not shown) on first barrier layer 240. In one embodiment, forming the first metal interconnect layer may also include performing an electroplating process (EPC) on the first metal seed layer to form first metal interconnect layer 250. In one embodiment, first metal interconnect layer 250 may also be formed on first TiN layer 233, as shown in FIG. 2E.

Figure 2F:
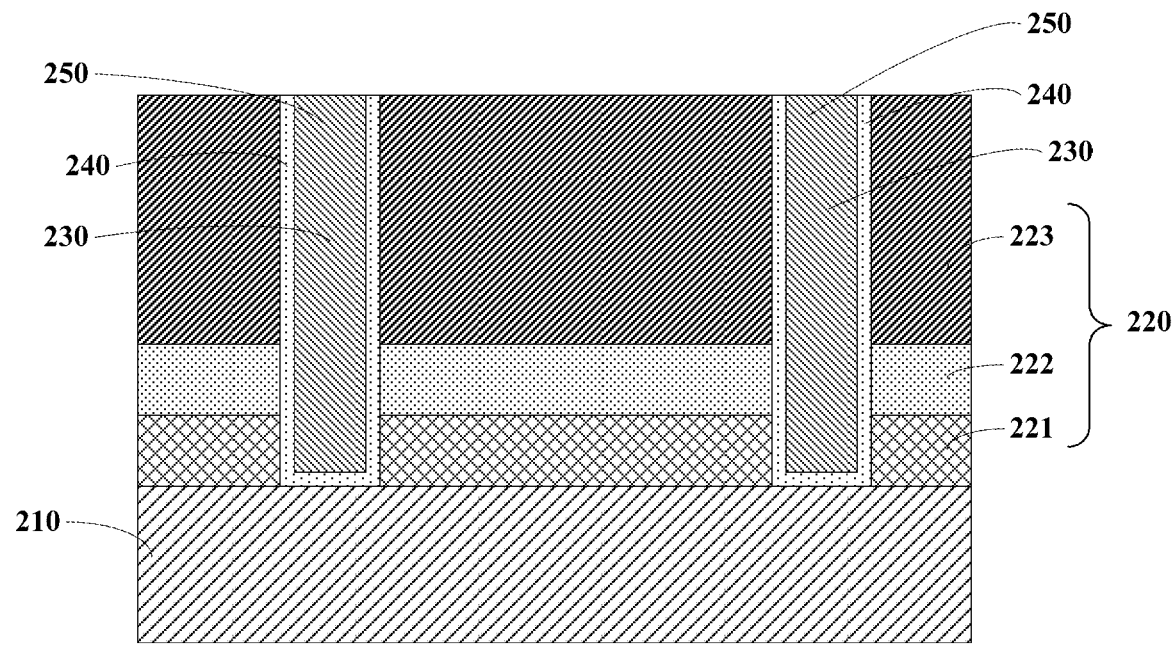

Next, referring to FIG. 2F, a planarization (e.g., CMP) is performed on first metal interconnect layer 250 to expose the upper surface of first dielectric layer 220. In an exemplary embodiment, the planarization process continues until the upper surface of first low-k dielectric layer 223 is exposed.

Thus, a method for forming a semiconductor structure according to step S101 of an embodiment of the present invention is provided.

Next, a hydrogen plasma cleaning process is performed on the upper surface of first metal interconnect layer 250.

Figure 2G:
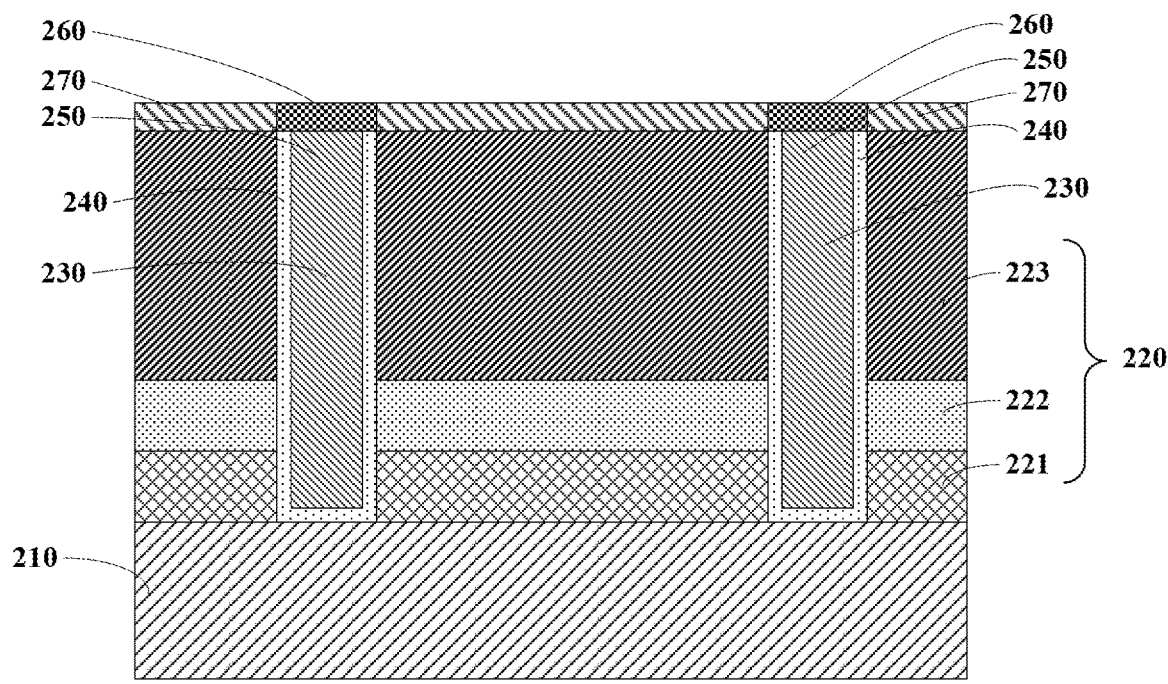

Next, referring to FIG. 2G, a graphene deposition process is performed to form a graphene layer 260 on first metal interconnect layer 250, and an amorphous carbon layer 270 is formed on first dielectric layer 220 (e.g., first low-k dielectric layer 223 in first dielectric layer 220). Graphene layer 260 is contiguous with amorphous carbon layer 270.

Thus, a method of forming an interconnect structure according to an embodiment of the present invention is provided. In the embodiment, a graphene layer is formed on the metal interconnect structure, and the amorphous carbon layer is formed on the first dielectric layer.

Figure 2H:
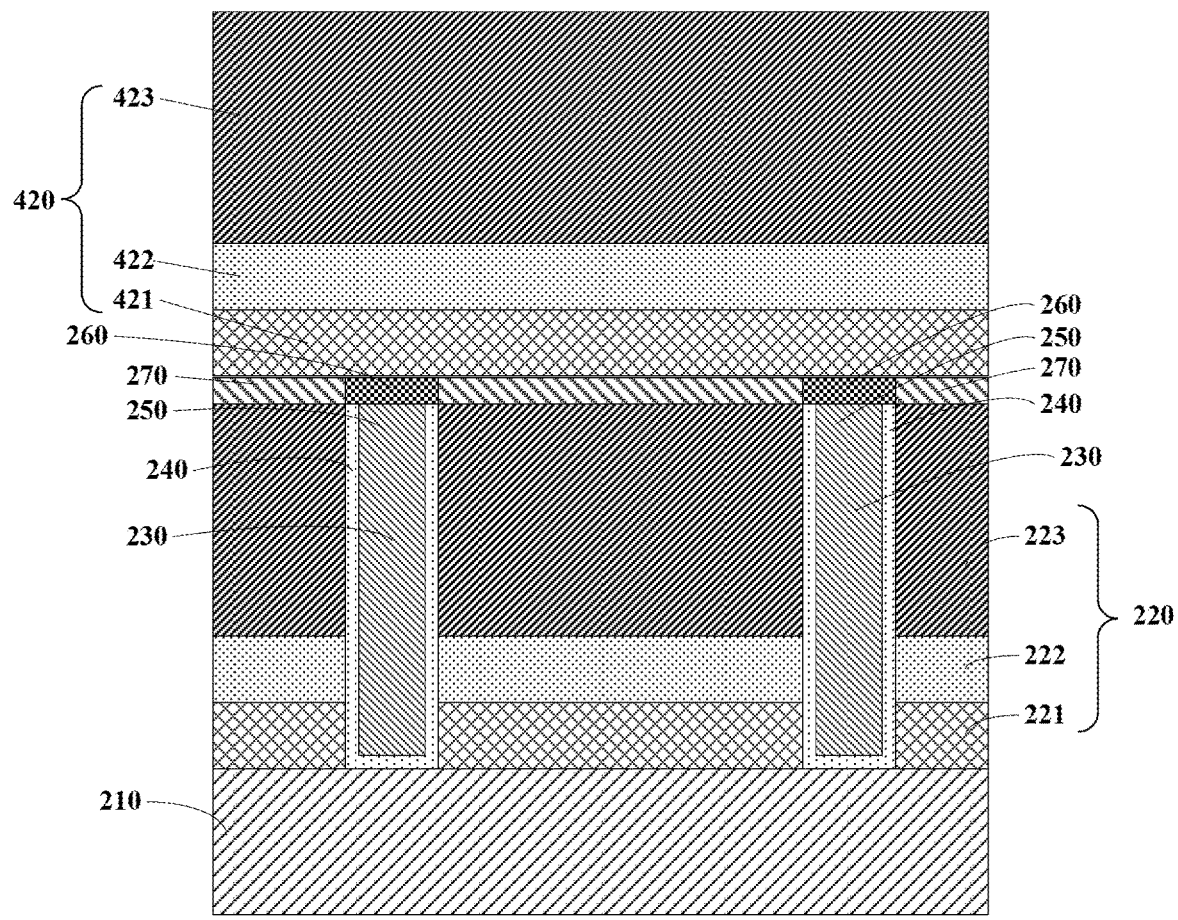

In one embodiment, referring to FIG. 2H, the method of forming an interconnect structure may further include forming a dielectric layer 420 on graphene layer 260 and amorphous carbon layer 270 for a next interconnect structure. Dielectric layer 420 may include a third silicon carbon nitride (SiCN) layer 421, a third silicon oxide layer 422 on third silicon carbon nitride layer 421, and a third low-k dielectric layer 423 on third silicon oxide layer 422.

In another embodiment, the graphene deposition process may not include forming an amorphous carbon layer on the first dielectric layer, and the above described method may further include forming a subsequent (third) dielectric layer on the graphene layer and the current dielectric layer for forming a subsequent (second or next) interconnect structure.

In another embodiment, the dielectric layer may include a second dielectric layer on the first dielectric layer. In another embodiment, the metal interconnect layer may further include a second metal interconnect layer formed in the second dielectric layer and in contact with the first metal interconnect structure.

Figure 3A:
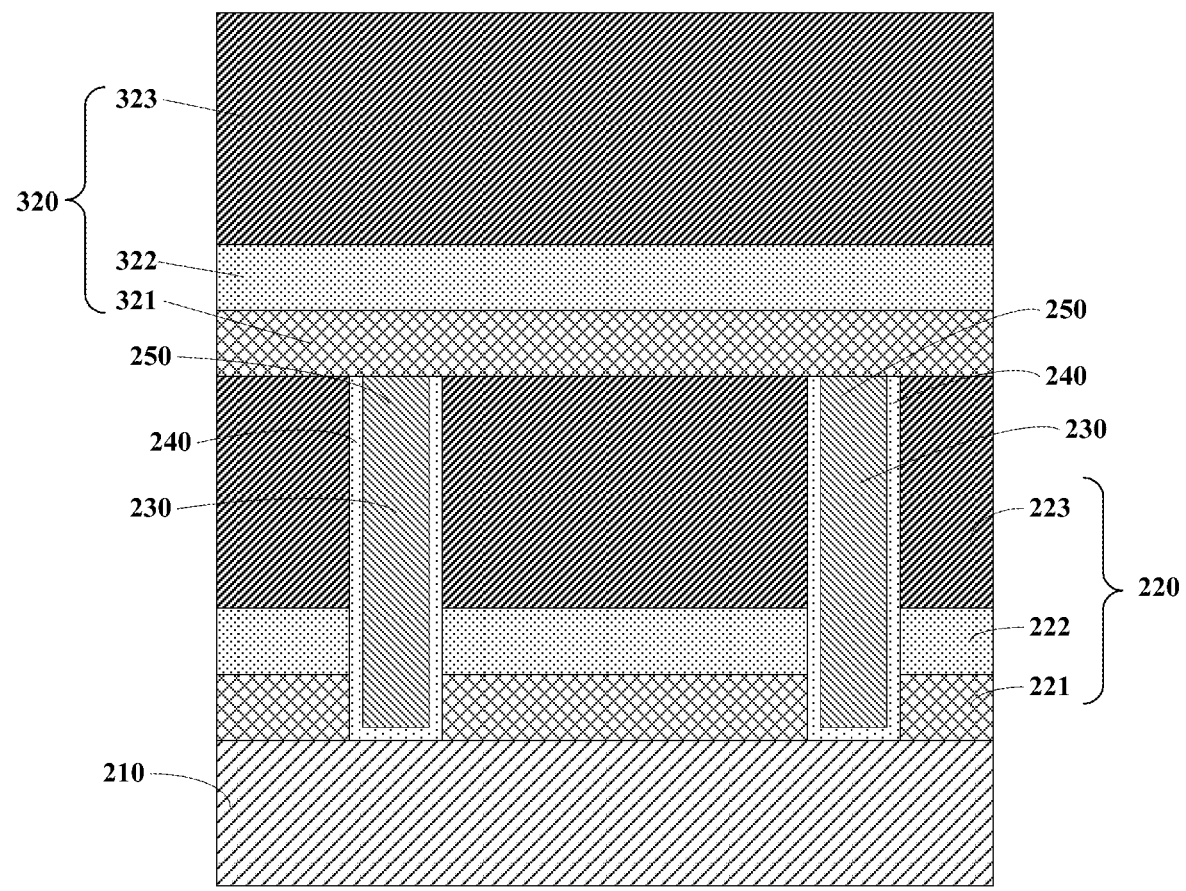
FIGS. 3A-3K are cross-sectional views illustrating intermediate stages of an interconnect structure according to another embodiment of the present invention.

FIGS. 3A through 3K are cross-sectional views illustrating intermediate stages of an interconnect structure in step S101 of FIG. 1 according to another embodiment of the present invention. A method of forming a semiconductor substrate will be described in detail below with reference to FIGS. 3A through 3K. The method may include:

Referring to FIG. 3A, a second dielectric layer 320 is formed on first dielectric layer 220 and first metal interconnect structure 250.

In one embodiment, the second dielectric layer may include the same or similar material or structure as that of the first dielectric layer. In an example embodiment, second dielectric layer may include a second silicon carbon nitride (SiCN) layer 321 on first dielectric layer 220 and first metal interconnect structure 250, a second silicon oxide layer 322 on second silicon carbon nitride 321, and a second low-k dielectric layer 323 on second silicon oxide layer 222. In one embodiment, the second silicon oxide layer may include silicon dioxide. In one embodiment, the second silicon oxide layer may include a very low amount of carbon. In one embodiment, the second low-k dielectric layer may include an ultra-low k dielectric constant material. For example, the second low-k dielectric layer may include a porous or non-porous hydrogenated silicon-carbide (SiOCH) layer.

Next, an etching process is performed on second dielectric layer 320 to form a second through-hole extending onto first interconnect structure 250. In one embodiment, the second through hole may be a through-hole having a damascene structure.

FIGS. 3B through 3G are cross-sectional views of intermediate stages of forming a through-hole having a damascene structure.

Figure 3B:
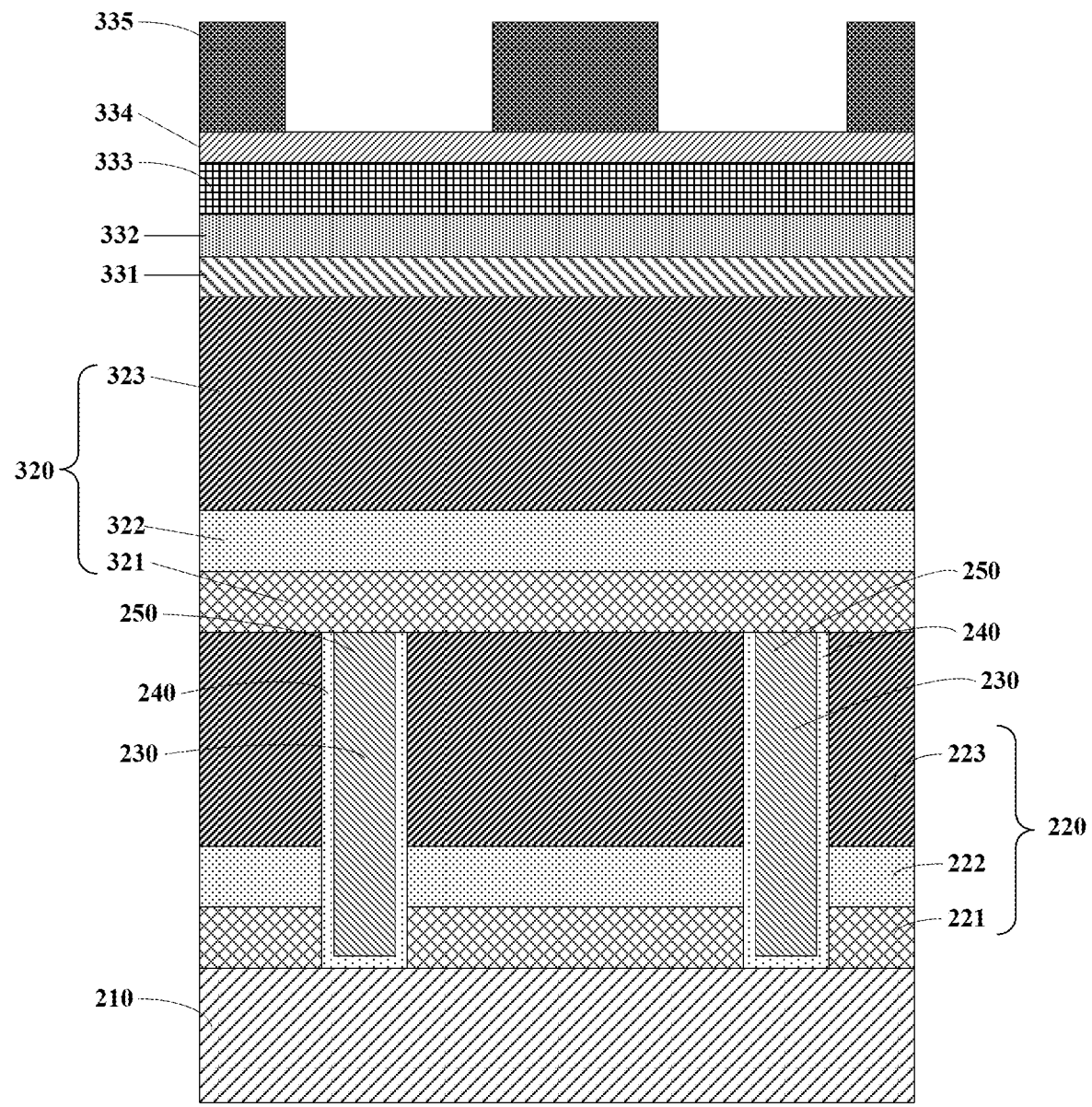

Referring to FIG. 3B, a second HMBD hardmask (e.g., a SiOCH hardmask) layer 331, a second HMTEOS hardmask (TEOS hardmask) layer 332, a second TiN (titanium nitride) layer 333, a second screen oxide (e.g., silicon oxide) layer 334, and a patterned second mask (e.g., photoresist) layer 335 are sequentially formed on second dielectric layer 320.

Figure 3C:
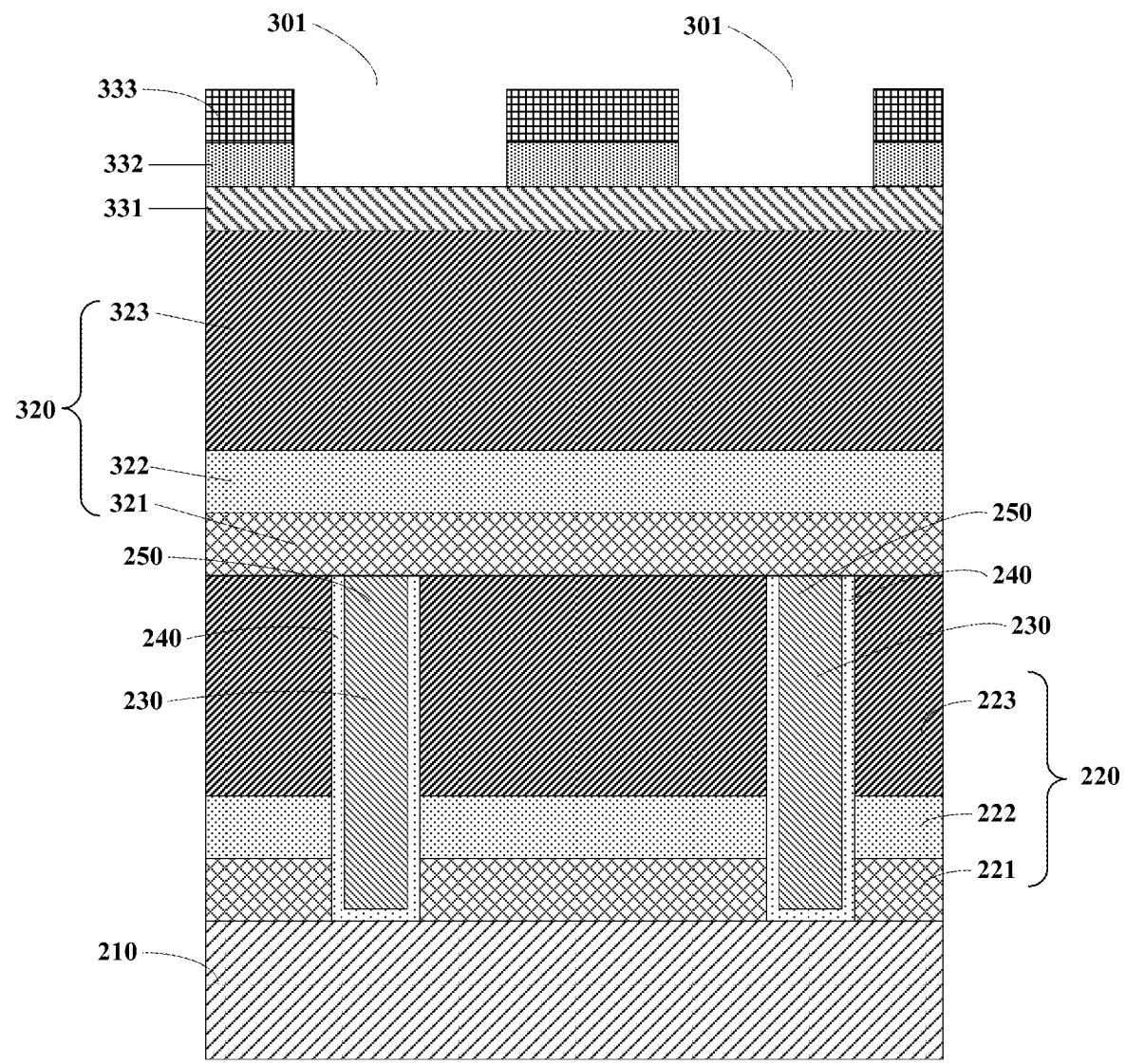

Thereafter, as shown in FIG. 3C, an etching process (e.g., dry etching and/or wet etching) is performed on second screen oxide layer 334, second TiN layer 333 and second HMTEOS hardmask layer 332 to form a first opening 301 using patterned second mask layer 335 as a mask. Second mask layer 335 and second screen oxide layer 334 are then removed, as shown in FIG. 3C.

Figure 3D:
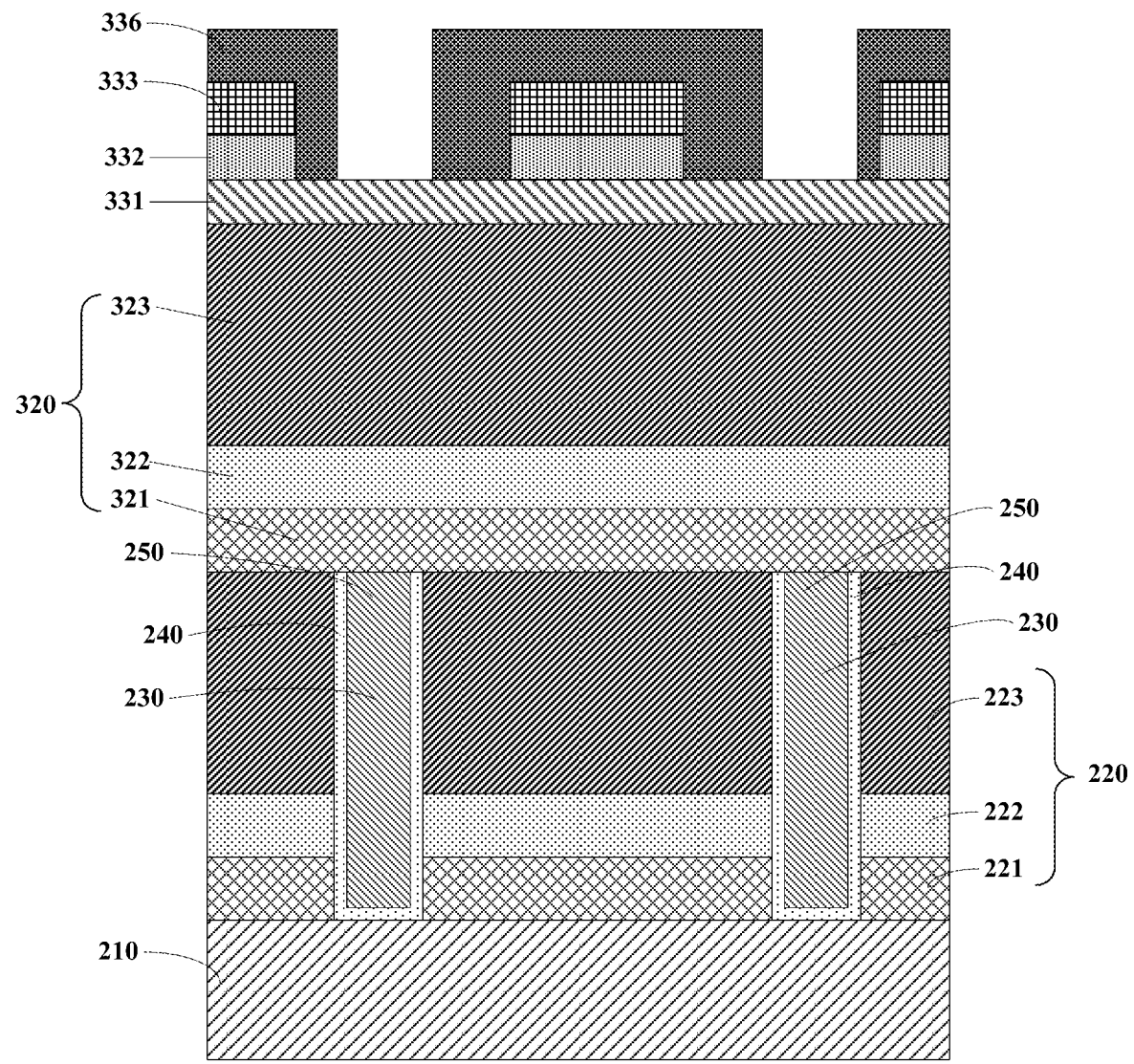

Next, referring to FIG. 3D, a patterned third hardmask layer (e.g., photoresist) 336 is formed on the structure shown in FIG. 3C, patterned third hardmask layer 336 covers etched second TiN layer 333 and second HMTEOS layer 332.

Figure 3E:
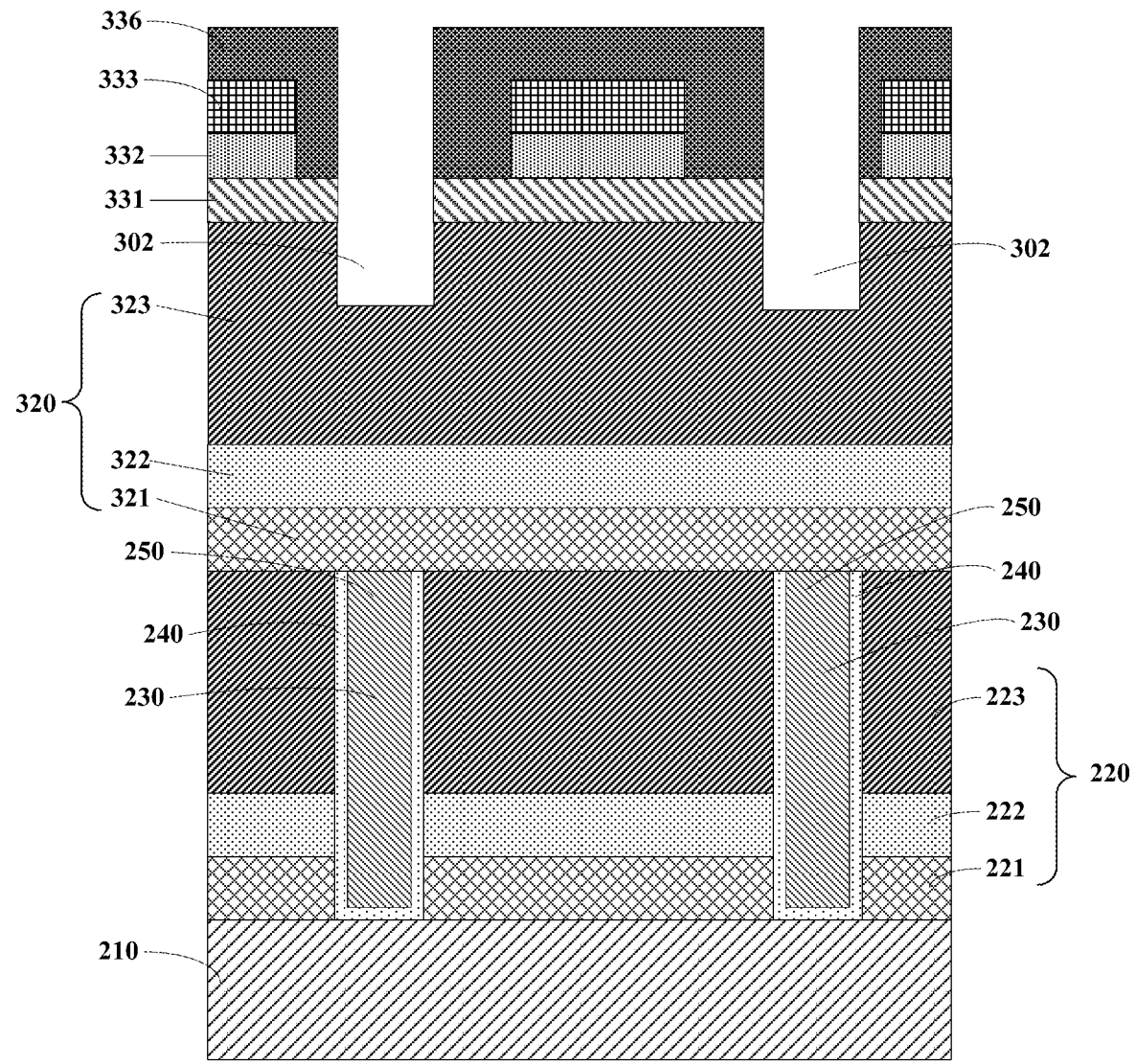

Next, referring to FIG. 3E, an etching process is performed on second HMBD layer 331 and second low-k dielectric layer 323 using patterned third hardmask layer 336 to form a second opening 302. In one embodiment, second opening 302 has a lateral dimension less than the lateral dimension of first opening 301.

Figure 3F:
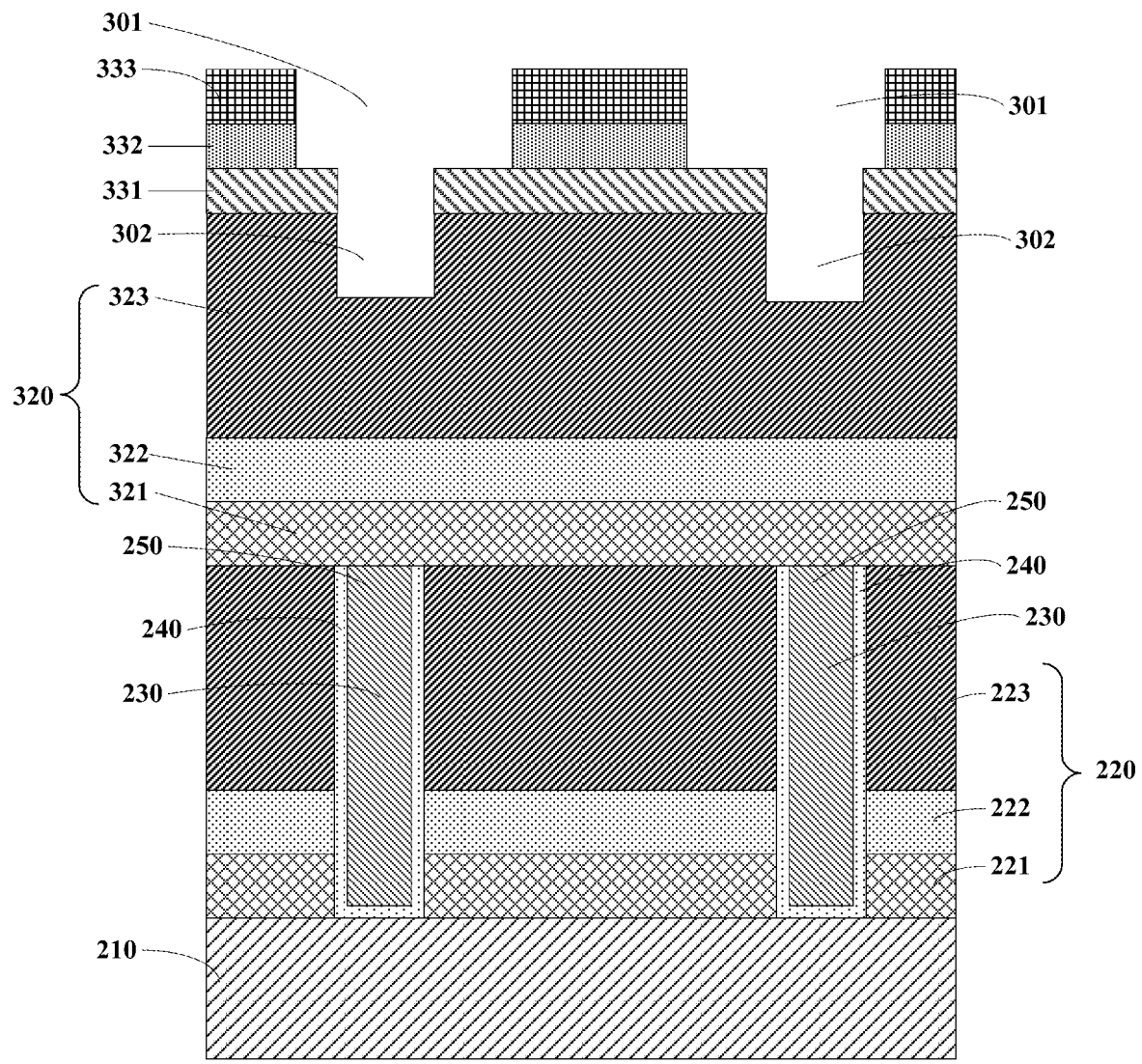

Next, referring to FIG. 3F, third hardmask layer 336 is removed.

Figure 3G:
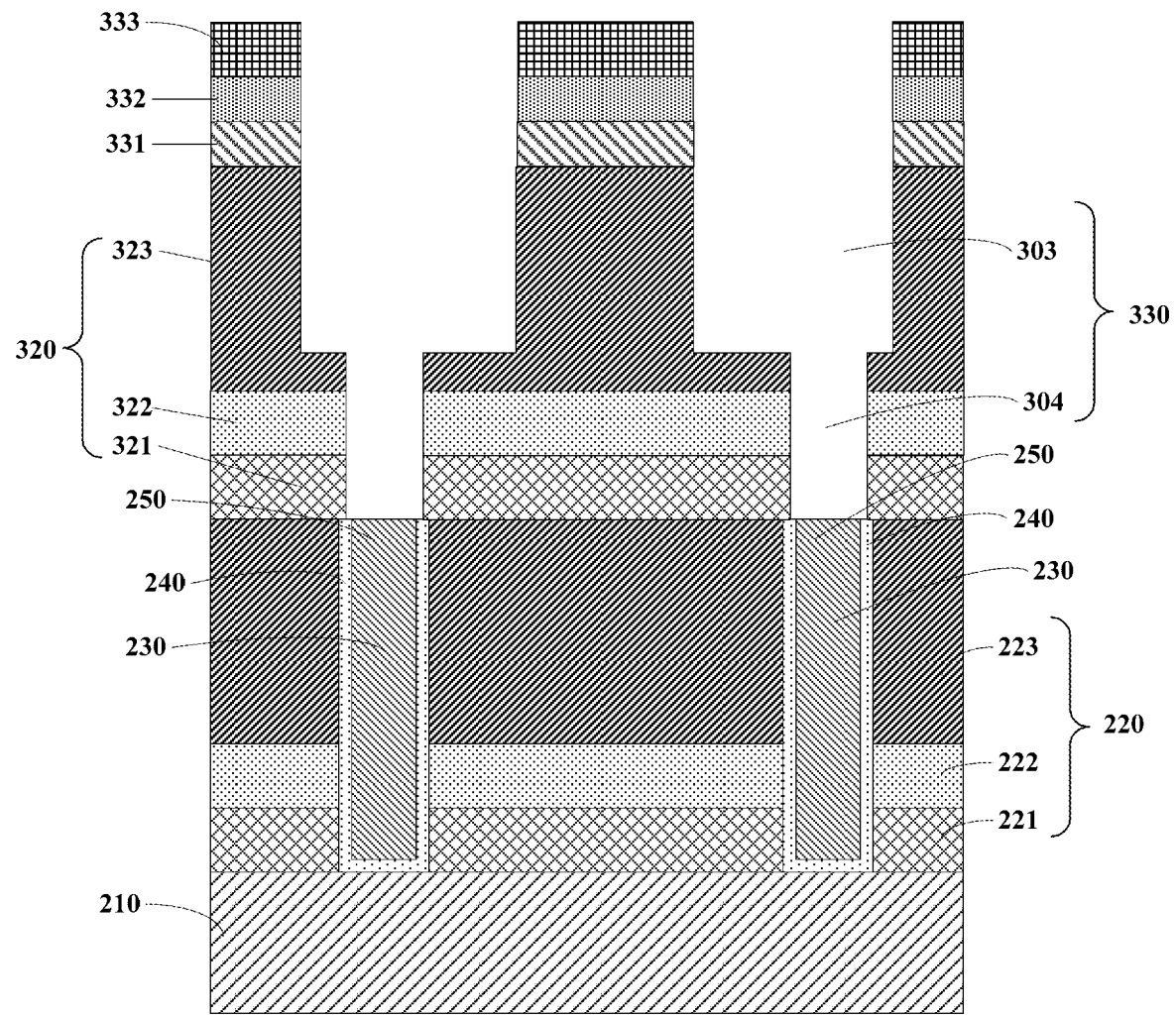

Next, referring to FIG. 3G, an etching process (e.g., a dry etching and/or wet etching) is performed on second HMBD layer 331, second low-k dielectric layer 323, second silicon oxide layer 322, and second silicon carbon nitride layer 321 to form a second through-hole 330 extending to first metal interconnect layer 250.

Figure 3H:
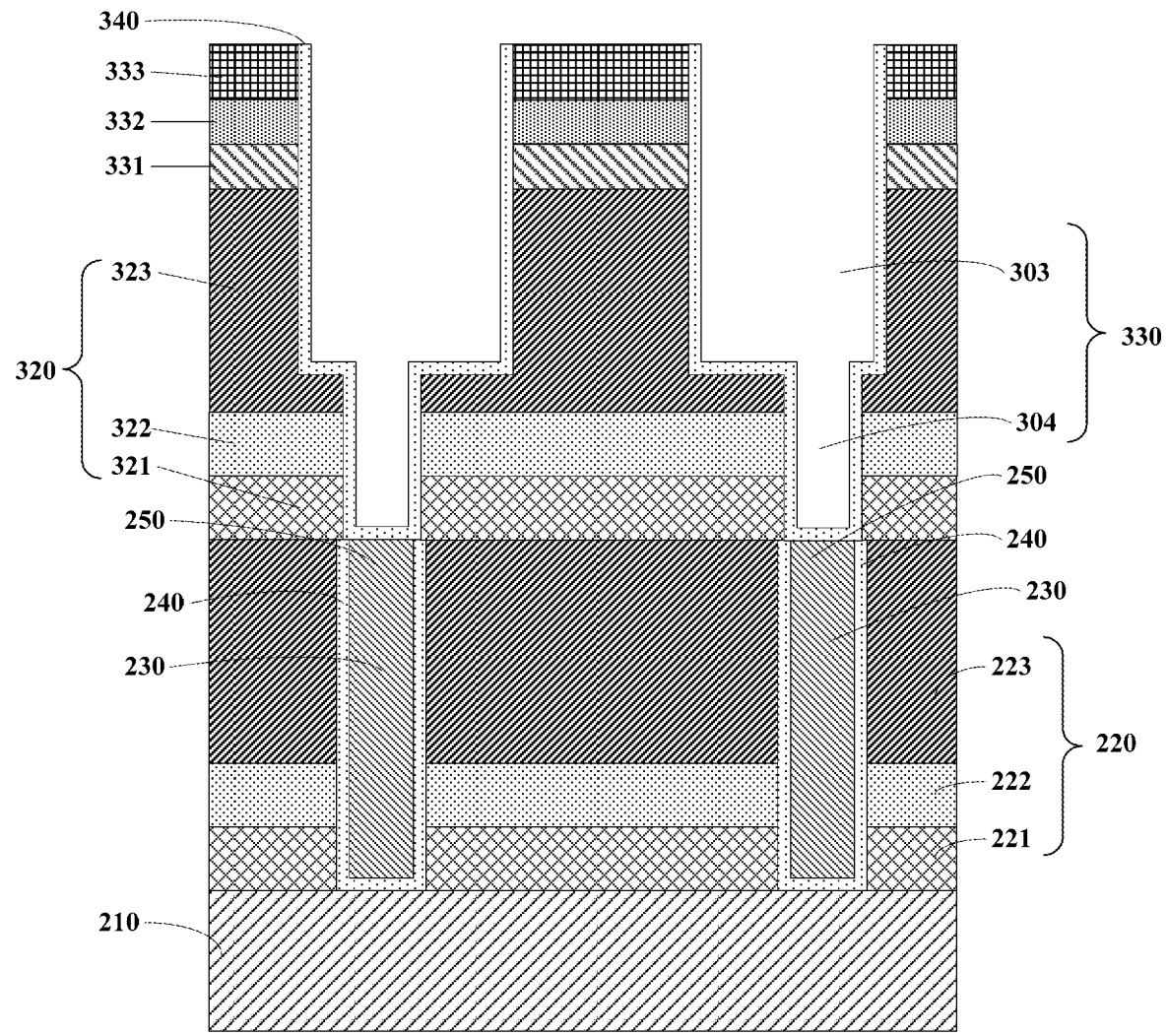

After forming the second through-hole, the step of providing the semiconductor substrate may further include forming a second barrier layer 340 on sidewalls and at the bottom of second through hole 330, as shown in FIG. 3H. In an example embodiment, second through-hole 330 may include tantalum nitride and tantalum.

Figure 3I:
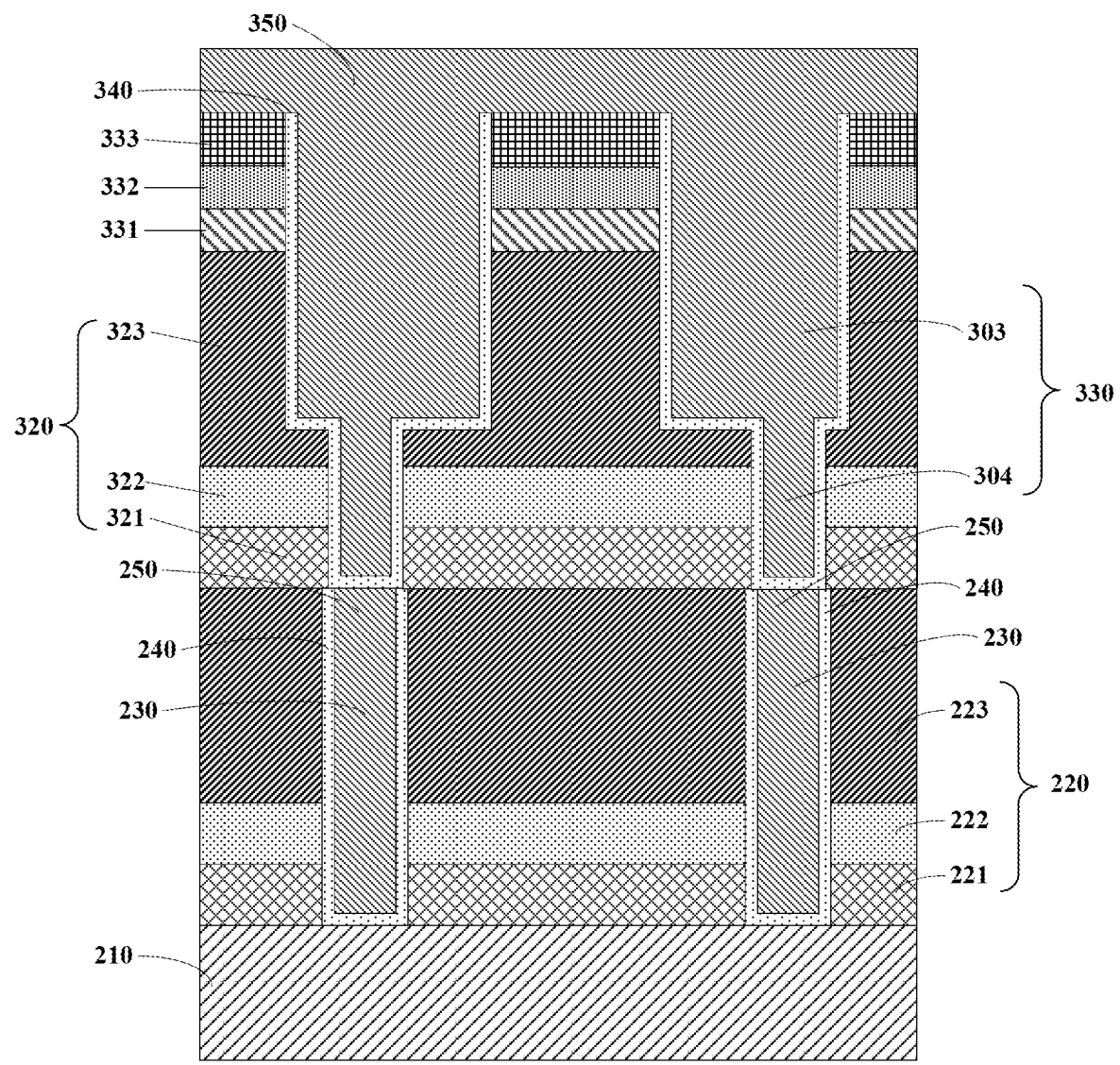

Next, referring to FIG. 3I, a second metal interconnect layer 350 is formed on second barrier layer 340 in second through-hole 330. In an example embodiment, the second metal interconnect layer may include copper. In one embodiment, the second through-hole has a damascene structure, the second metal interconnect layer filling the second through-hole is a metal interconnect layer of the damascene structure.

In one embodiment, the step of forming the second metal interconnect layer may include forming a second metal seed layer (not shown) on second barrier layer 340. In an embodiment, the step of forming the second metal interconnect layer may further include forming second metal interconnect layer 350 on the second metal seed layer using an electroplating process.

Figure 3J:
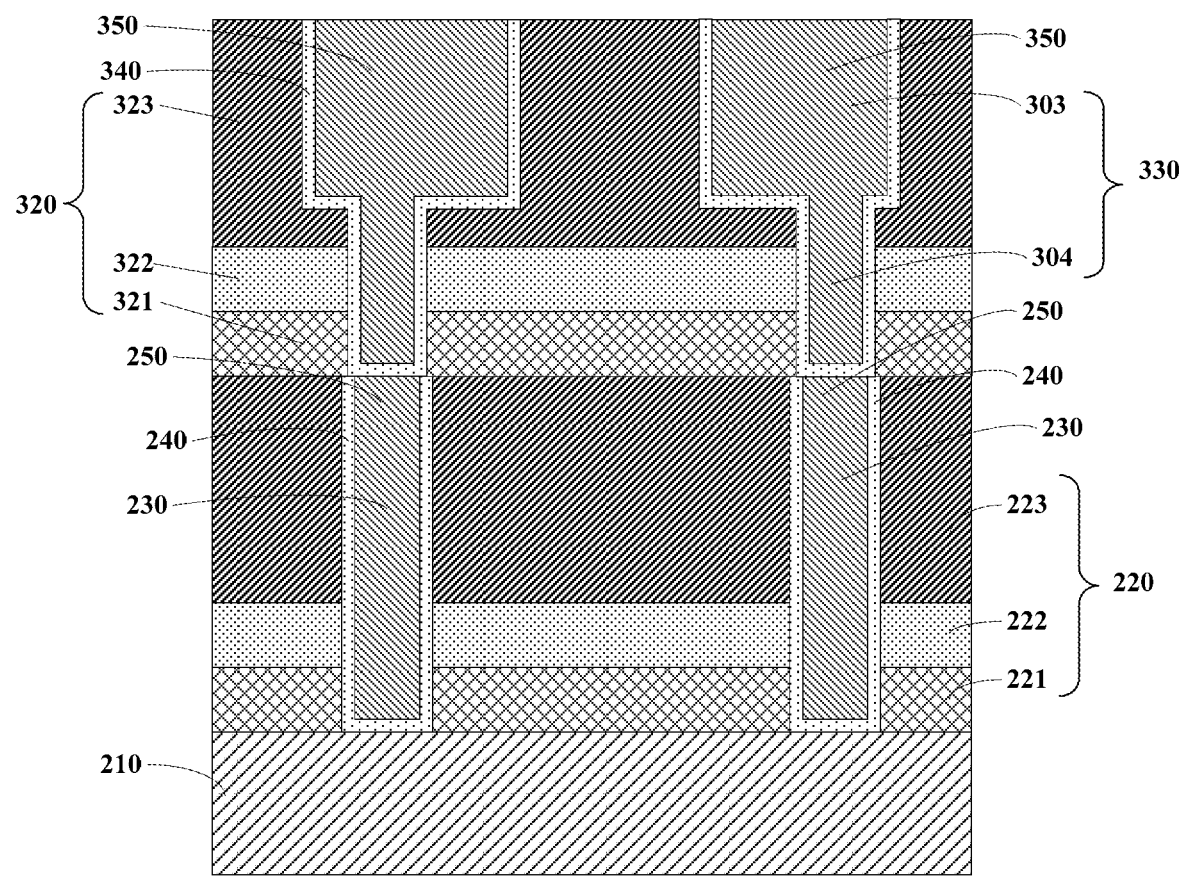

Next, referring to FIG. 3J, a planarization is performed on the substrate structure after forming the second interconnect layer to expose the upper surface of second dielectric layer 320, e.g., exposing the upper surface of second low-k dielectric layer 323.

Figure 3K:
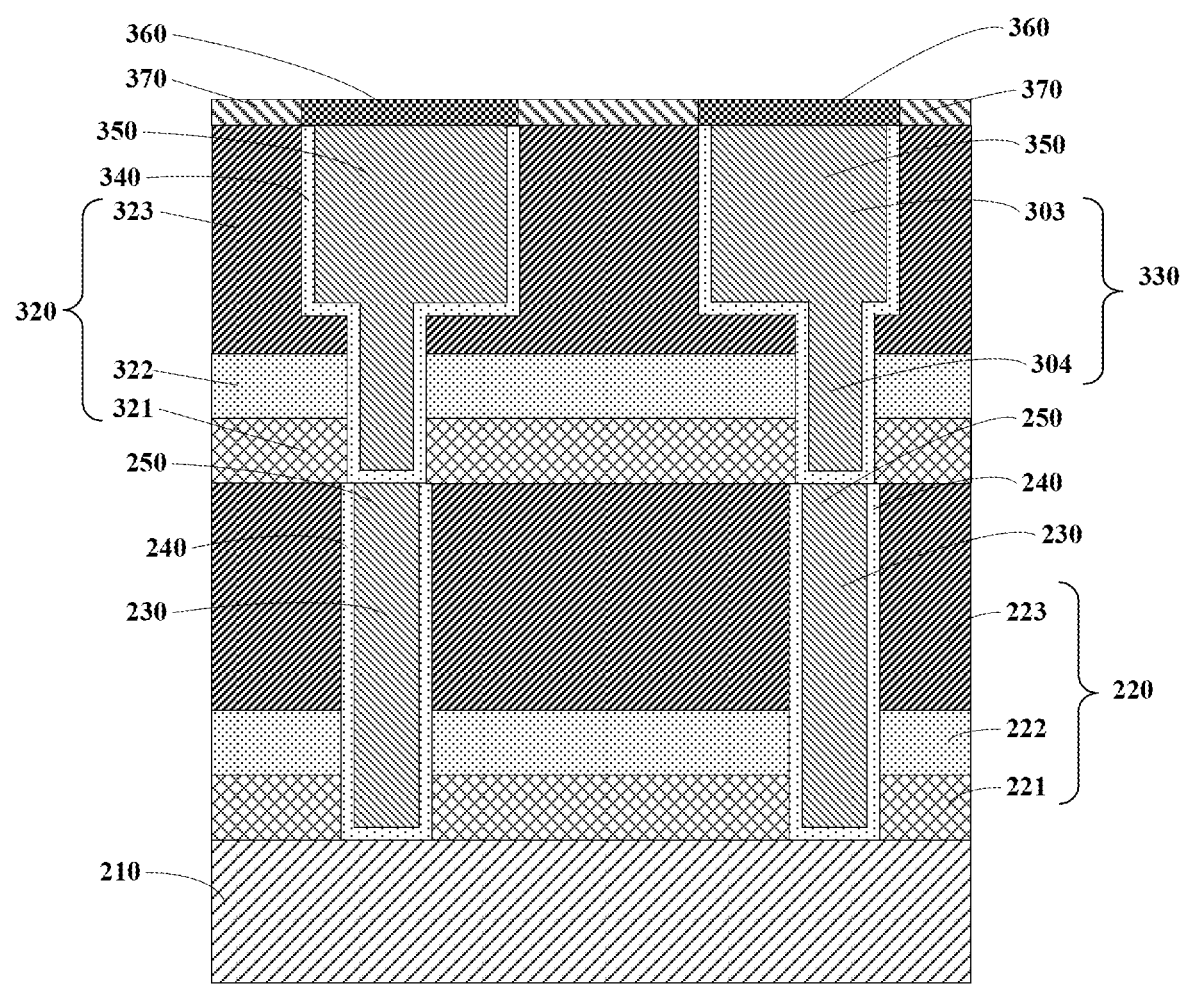

Next, referring to FIG. 3K, a graphene deposition is performed to form a graphene layer 360 on second metal interconnect layer 350, and an amorphous carbon layer 370 is formed on second dielectric layer 320 (e.g., second low-k dielectric layer 320 in second dielectric layer 323). Graphene layer 360 is contiguous with (adjacent) amorphous carbon layer 370. That is, in the embodiment, the graphene layer is formed on the second metal interconnect layer, and the amorphous carbon layer is formed on the second dielectric layer.

Thus, embodiments of the present invention provide another method for manufacturing an interconnect structure.

The manufacturing method according to some embodiments of the present invention provide an interconnect structure having a substrate and a dielectric layer (e.g., a first dielectric layer 220 or second dielectric layer 320) on the substrate. The interconnect structure may also include a metal interconnect layer (e.g., a first metal interconnect layer 250 or a second metal interconnect layer 350) in the dielectric layer and in contact with the substrate. The dielectric layer has an upper surface that is flush with the upper surface of the metal interconnect layer. In an embodiment, the metal interconnect layer includes copper. The interconnect structure may also include a graphene layer (e.g., graphene layer 260 or 360) on the metal interconnect layer. In the interconnect structure, the graphene layer isolates tge metal from the air and prevents the metal from being oxidized by oxygen in the air, thereby increasing the queue time of the CMP process, facilitating the manufacturing process, and improving the reliability of the device.

In one embodiment, the interconnect structure may also include an amorphous carbon layer (e.g., amorphous carbon layer 270 or 370) disposed on the dielectric layer. The graphene layer abuts the amorphous carbon layer. The amorphous carbon layer may serve as an insulator layer to prevent the graphene layers from being in contact with different metal layers, thereby preventing the different metal layers from being in contact with each other.

In one embodiment, a graphene layer may include one to thirty (1 to 30) layers of graphene monoatomic layers.

In one embodiment, the metal interconnect layer may be a metal interconnect layer of a damascene structure.

In one embodiment, the interconnect structure may also include a barrier layer (e.g., a first barrier layer 240 and/or a second barrier layer 340) disposed between the dielectric layer and the metal interconnect layer. The barrier layer prevents the metal from diffusing into the dielectric layer. In another embodiment, the barrier layer may also be formed on the substrate. In another embodiment, the barrier layer may include tantalum nitride and tantalum.

In one embodiment, the interconnect structure may also include a dielectric layer (e.g., a dielectric layer 420) on the graphene layer and the amorphous carbon layer for forming a next interconnect structure. The graphene layer prevents the diffusion of a metal, e.g., copper, into a dielectric layer formed thereon (e.g., the dielectric layer for use in the next interconnect structure), so that the problems of decreasing k-value of the dielectric and even short circuits caused by metal diffusion into the dielectric can be avoided, thereby improving the reliability of the device.

In one embodiment, referring to FIG. 2G, the substrate may include a semiconductor substrate 210. The dielectric layer may include a first dielectric layer 220 on semiconductor substrate 210. The metal interconnect layer may include a first metal interconnect layer 250 formed on first dielectric layer 220 and in contact with semiconductor substrate 210. In one embodiment, as shown in FIG. 2G, graphene layer 260 may be formed on first metal interconnect layer 250, and amorphous carbon layer 270 may be formed on first dielectric layer 220.

In one embodiment, first dielectric layer 220 may include a first silicon carbon nitride layer 221 on semiconductor substrate 210, a first silicon oxide layer 222 on first silicon carbon nitride layer 221, and a first low-k dielectric layer 223 on first silicon oxide layer 222. In an exemplary embodiment, the first low-k dielectric layer may include a porous or a non-porous SiOCH layer.

In another embodiment, referring to FIG. 3K, the dielectric layer may include, in addition to first dielectric layer 220 on semiconductor substrate 210, a second dielectric layer 320 on first dielectric layer 220. In another embodiment, as shown in FIG. 3K, the metal interconnect layer may include, in addition to first metal interconnect layer 250 formed in first dielectric layer 220 and in contact with semiconductor substrate 210, a second metal interconnect layer 350 formed in second dielectric layer 320 and in contact with first metal interconnect metal 250. Graphene layer 360 may be formed on second metal interconnect layer 350, and amorphous carbon layer 370 may be formed on second dielectric layer 320.

In one embodiment, second dielectric layer 320 may include a second silicon carbon nitride layer 321 on first dielectric layer 220 and first metal interconnect layer 250, a second silicon oxide layer 322 on second silicon carbon nitride layer 321, and a second low-k dielectric layer 323 on second silicon oxide layer 322. In an example embodiment, the second low-k dielectric layer may include a porous or non-porous SiOCH layer.

Thus, embodiments of the present invention provide detailed description of methods for manufacturing an interconnect structure and interconnect structures manufactured using the described methods. In the description, numerous specific details such as forming a dielectric layer, an amorphous carbon layer, dry and/or wet etching the dielectric layer, forming a graphene layer by deposition, and the like have not been described in detail in order not to obscure the embodiments of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive.

Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. An interconnect structure comprising:
   a substrate;
   a first dielectric layer comprising a first silicon carbon nitride (SiCN) layer directly on the substrate, a first silicon dioxide layer directly on the first SiCN layer, and a first hydrogenated silicon-carbide (SiOCH) layer directly on the first silicon dioxide layer;
   a first metal interconnect layer in the first dielectric layer and in contact with the substrate, the first metal interconnect layer having an upper surface flush with an upper surface of the first dielectric layer;
   a first barrier layer disposed between the first dielectric layer and the first metal interconnect layer and between a bottom of the first metal interconnect layer and the substrate, the first barrier layer having an upper surface flush with the upper surface of the first dielectric layer, wherein the first metal interconnect layer and the first barrier layer go through sequentially the first hydrogenated silicon-carbide (SiOCH) layer, the first silicon dioxide layer, and the first SiCN layer;
   a second dielectric layer on the first dielectric layer;
   a second metal interconnect layer in the second dielectric layer and in contact with the first metal interconnect layer;
   a second barrier layer disposed between the first metal interconnect layer and the second metal interconnect layer and comprising a bottom in direct contact with the first metal interconnect layer and the first barrier layer;
   a graphene layer on the second metal interconnect layer and directly contacting an upper surface of the second barrier layer; and
   an amorphous carbon layer on the second dielectric layer and having an upper surface flush with an upper surface of the graphene layer, wherein the amorphous carbon layer is not in contact with the second barrier layer, and an interface surface between the graphene layer and the amorphous carbon layer is aligned with an interface surface between the second barrier layer and the second dielectric layer.

2. The interconnect structure of claim 1, wherein the amorphous carbon layer is adjacent to the graphene layer.

3. The interconnect structure of claim 1, wherein:
   the substrate comprises a semiconductor substrate; and
   the second dielectric layer comprises a second silicon carbon nitride (SiCN) layer.

4. The interconnect structure of claim 3, wherein the graphene layer is formed on the second metal interconnect layer, and the amorphous carbon layer is formed on the second dielectric layer.

5. The interconnect structure of claim 3,
   wherein the second dielectric layer further comprises a second silicon dioxide layer formed on the second SiCN layer.

6. The interconnect structure of claim 5,
   wherein the second dielectric layer further comprises a second hydrogenated silicon-carbide (SiOCH) layer on the second silicon dioxide layer.

7. The interconnect structure of claim 1, wherein the upper surface of the second barrier layer is flush with an upper surface of the second dielectric layer.

8. The interconnect structure of claim 7, further comprising a third dielectric layer on the graphene layer and the amorphous carbon layer for a next interconnect structure.

9. The interconnect structure of claim 1, wherein the graphene layer comprises 1 to 30 layers of graphene monoatomic layers.

10. The interconnect structure of claim 1, wherein the second metal interconnect layer comprises a damascene structure.

11. The interconnect structure of claim 1, wherein:
the second barrier layer comprises tantalum nitride and tantalum; and
the second metal interconnect layer comprises copper.

12. The interconnect structure of claim 1, wherein:
the second barrier layer is formed directly on the first barrier layer and the first metal interconnect layer and covers completely a top surface of the first metal interconnect layer, and
a size of a bottom of the second barrier layer is smaller than a size of a bottom of the first barrier layer.

13. An interconnect structure comprising:
a substrate;
a dielectric layer comprising a silicon carbon nitride layer (SiCN) directly on the substrate, a silicon dioxide layer directly on the silicon carbon nitride layer, and a hydrogenated silicon-carbide layer (SiOCH) directly on the silicon dioxide layer;
a metal interconnect layer in the dielectric layer and having an upper surface flush with an upper surface of the dielectric layer;
a barrier layer disposed between the dielectric layer and the metal interconnect layer and between the metal interconnect layer and the substrate, the barrier layer having an upper surface flush with the upper surface of the dielectric layer, wherein the metal interconnect layer and the barrier layer go through sequentially the hydrogenated silicon-carbide layer(SiOCH), the silicon dioxide layer, and the silicon carbon nitride layer (SiCN);
a graphene layer on the metal interconnect layer and directly contacting the upper surface of the barrier layer; and
an amorphous carbon layer on the dielectric layer and having an upper surface flush with an upper surface of the graphene layer, wherein the amorphous carbon layer is not in contact with the barrier layer, and an interface surface between the graphene layer and the amorphous carbon layer is aligned with an interface surface between the barrier layer and the dielectric layer.

14. The interconnect structure of claim 13, wherein the amorphous carbon layer is adjacent to the graphene layer.

15. The interconnect structure of claim 13, wherein:
the substrate comprises a semiconductor substrate;
the dielectric layer further comprises a first dielectric layer on the semiconductor substrate; and
the metal interconnect layer comprises a first metal interconnect layer formed in the first dielectric layer and having a bottom in contact with the barrier layer.

16. The interconnect structure of claim 15, wherein the graphene layer is formed on the first metal interconnect layer, and the amorphous carbon layer is formed on the first dielectric layer.

17. The interconnect structure of claim 15, wherein:
the dielectric layer further comprises a second dielectric layer formed on the first dielectric layer;
the metal interconnect layer further comprises a second metal interconnect layer formed on the second dielectric layer and in contact with the first metal interconnect layer;
the graphene layer is formed on the second metal interconnect layer; and
the amorphous carbon layer is formed on the second dielectric layer.

18. The interconnect structure of claim 13, wherein the graphene layer comprises 1 to 30 layers of graphene monoatomic layers.

19. The interconnect structure of claim 13, wherein the metal interconnect layer comprises a damascene structure.

20. The interconnect structure of claim 17, wherein the barrier layer comprises:
a first barrier layer comprising tantalum nitride and tantalum and disposed between the bottom of the first metal interconnect layer and the substrate; and
a second barrier layer comprising tantalum nitride and tantalum and disposed between the second dielectric layer and the second metal interconnect layer.

* * * * *